United States Patent
Cheng et al.

(10) Patent No.: US 12,255,440 B2
(45) Date of Patent: Mar. 18, 2025

(54) SEMICONDUCTOR LASER WITH A MODE EXPANSION LAYER

(71) Applicant: Huawei Technologies Co., Ltd., Shenzhen (CN)

(72) Inventors: Ning Cheng, Plano, TX (US); Xiang Liu, Plano, TX (US); Frank Effenberger, Frisco, TX (US)

(73) Assignee: Huawei Technologies Co., Ltd., Shenzhen (CN)

( * ) Notice: Subject to any disclaimer, the term of this patent is extended or adjusted under 35 U.S.C. 154(b) by 656 days.

(21) Appl. No.: 17/561,187

(22) Filed: Dec. 23, 2021

(65) Prior Publication Data

US 2022/0115841 A1  Apr. 14, 2022

Related U.S. Application Data

(63) Continuation of application No. PCT/US2020/038956, filed on Jun. 22, 2020.

(Continued)

(51) Int. Cl.
*H01S 5/10* (2021.01)
*H01S 5/20* (2006.01)
(Continued)

(52) U.S. Cl.
CPC ......... *H01S 5/1014* (2013.01); *H01S 5/2081* (2013.01); *H01S 5/22* (2013.01);
(Continued)

(58) Field of Classification Search
CPC .... H01S 5/1014; H01S 5/2081; H01S 5/2205; H01S 5/343; H01S 5/2086; H01S 2301/18
See application file for complete search history.

(56) References Cited

U.S. PATENT DOCUMENTS

| | | | |
|---|---|---|---|
| 6,052,397 A * | 4/2000 | Jeon | H01S 5/164 372/46.01 |
| 2004/0081214 A1 | 4/2004 | Mawst | |

(Continued)

FOREIGN PATENT DOCUMENTS

CN  104246560 A  12/2014

OTHER PUBLICATIONS

Elliott, et al., "Manufacturing-tolerant Compact Red-emitting Laser Diode Designs for Next Generation Applications," IET Optoelectronics, The Institution of Engineering and Technology, Michael Faraday House, Six Hills Way, Stevenage, Herts. SG1 2AY, UK, vol. 9, No. 2, Apr. 1, 2015 (Apr. 1, 2015), pp. 75-81, XP006051620.

(Continued)

*Primary Examiner* — Yuanda Zhang
(74) *Attorney, Agent, or Firm* — Conley Rose, P.C.

(57) ABSTRACT

A semiconductor laser comprises: a substrate; a first cladding layer disposed above the substrate; a second cladding layer disposed above the first cladding layer so that the first cladding layer is positioned between the substrate and the second cladding layer; and a first mode expansion layer within the first cladding layer, a second mode expansion layer within the second cladding layer, or both the first mode expansion layer within the first cladding layer and the second mode expansion layer within the second cladding.

21 Claims, 9 Drawing Sheets

Related U.S. Application Data

(60) Provisional application No. 62/865,821, filed on Jun. 24, 2019.

(51) Int. Cl.
*H01S 5/22* (2006.01)
*H01S 5/34* (2006.01)
*H01S 5/343* (2006.01)
*H01S 5/32* (2006.01)

(52) U.S. Cl.
CPC .......... *H01S 5/2205* (2013.01); *H01S 5/3409* (2013.01); *H01S 5/343* (2013.01); *H01S 5/2086* (2013.01); *H01S 5/3213* (2013.01); *H01S 2301/18* (2013.01)

(56) References Cited

U.S. PATENT DOCUMENTS

2012/0183009 A1     7/2012   Adachi
2014/0133817 A1     5/2014   Lealman

OTHER PUBLICATIONS

Hatori, et al., "A Hybrid Integrated Light Source on a Silicon Platform Using a Trident Spot-Size Converter," Journal of Lightwave Technology, vol. 32, No. 7, Apr. 1, 2014, pp. 1329-1336.

Kawano, et all., "Coupling and Conversion Characteristics of Spot-Size-Converter Integrated Laser Diodes," IEEE Journal of Selected Topics in Quantum Electronics, vol. 3, No. 6, Dec. 1997, pp. 1351-1360.

Maegami, et al., "Spot-size Converter with a SiO2 Spacer Layer Between Tapered Si and SiON Waveguides for Fiber-to-chip Coupling," Optics Express 21287, vol. 23, No. 16, Aug. 5, 2015, 9 pages.

Rahman, et al., "Improved Laser-Fiber Coupling by Using Spot-Size Transformer," IEEE Photonics Technology Letters, vol. 8, No. 4, Apr. 1996, pp. 557-559.

Smowton, et al., "650-nm Lasers with Narrow Far-Field Divergence with Integrated Optical Mode Expansion Layers," IEEE Journal of Selected Topics in Quantum Electronics, vol. 5, No. 3, May/Jun. 1999, pp. 735-739.

Yen, et al., "Theoretical Investigation on Semiconductor Lasers with Passive Waveguides," IEEE Journal of Quantum Electronics, vol. 32, No. 1, Jan. 1996, pp. 4-13.

Irie, Y., et al., "Over 200mW 980nm pump laser diode module using optimized high-coupling lensed fiber," IEEE, Feb. 21, 1999, pp. 238-240.

Moerman, I., et al., "A Review on Fabrication Technologies for the Monolithic Integration of Tapers with III-V Semiconductor Devices," IEEE Journal of Selected Topics in Quantum Electronics, vol. 3, No. 6, Dec. 1997, pp. 1308-1320.

Chen, W.T., et al., "Laser-to-Fiber Coupling Scheme by Utilizing a Lensed Fiber Integrated with a Long-Period Fiber Grating," IEEE Photonics Technology Letters, vol. 12, No. 5, May 2000, pp. 501-503.

Adachi, K., et al., "A 1.3-um Lens-Integrated Horizontal-Cavity Surface-Emitting Laser with Direct and Highly Efficient Coupling to Optical Fibers," IEEE, 2009, 3 pages.

\* cited by examiner

SEMICONDUCTOR LASER WITH A MODE EXPANSION LAYER

CROSS-REFERENCE TO RELATED APPLICATIONS

This is a continuation of Int'l Patent App. No. PCT/US2020/038956 filed on Jun. 22, 2020, which claims priority to U.S. Prov. Patent App. No. 62/865,821 filed on Jun. 24, 2019, both of which are incorporated by reference.

TECHNICAL FIELD

The disclosed embodiments relate to optical devices in general and a semiconductor laser with a mode expansion layer in particular.

BACKGROUND

Semiconductor lasers, or diode lasers, are widely used as transmitter optical sources in optical communications applications such as PONs. Semiconductor lasers are used because they have a small size, high efficiency, high-speed modulation, a low cost, and the ability to easily couple to optical fibers. Users continually demand increased bandwidth, so it is desirable to increase modulation speeds of semiconductor lasers in order to meet that demand.

SUMMARY

In a first aspect, a semiconductor laser comprises: a substrate; a first cladding layer disposed above the substrate; a second cladding layer disposed above the first cladding layer so that the first cladding layer is positioned between the substrate and the second cladding layer; and a first mode expansion layer within the first cladding layer, a second mode expansion layer within the second cladding layer, or both the first mode expansion layer within the first cladding layer and the second mode expansion layer within the second cladding.

In a first portion of the semiconductor laser comprising the mode expansion layer, the mode expansion layer decreases the far-field angle of the semiconductor laser, while not significantly decreasing the average optical confinement factor of the semiconductor laser, and thus the frequency response and the modulation speed of the semiconductor laser. Specifically, the mode expansion layer may decrease a vertical far-field angle of the semiconductor laser from about 30.2° to about 24.4°. In a second portion of the semiconductor laser not comprising the mode expansion layer, the absence of the mode expansion layer maintains the average optical confinement factor of the semiconductor laser, and thus the frequency response and the modulation speed of the semiconductor laser. A manufacturer may form the mode expansion layer without using exotic fabrication. For instance, the manufacturer may use available epitaxial growth, etching, and regrowth processes.

In a first implementation form of the first aspect, the first cladding layer comprises a first refractive index, and the first mode expansion layer comprises a second refractive index that is higher than the first refractive index.

In a second implementation form of the first aspect or a preceding implementation form of the first aspect, the second cladding layer comprises a first refractive index, and the second mode expansion layer comprises a second refractive index that is higher than the first refractive index.

In a third implementation form of the first aspect or a preceding implementation form of the first aspect, the semiconductor laser comprises a first length, and the first mode expansion layer comprises a second length that is smaller than the first length.

In a fourth implementation form of the first aspect or a preceding implementation form of the first aspect, the semiconductor laser comprises a first length, and the second mode expansion layer comprises a second length that is smaller than the first length.

In a fifth implementation form of the first aspect or a preceding implementation form of the first aspect, the semiconductor laser further comprises a first confinement layer disposed above the first cladding layer so that the first cladding layer is positioned between the substrate and the first confinement layer.

In a sixth implementation form of the first aspect or a preceding implementation form of the first aspect, the semiconductor laser further comprises a quantum well layer disposed above the first confinement layer so that the first confinement layer is positioned between the first cladding layer and the quantum well layer.

In a seventh implementation form of the first aspect or a preceding implementation form of the first aspect, the semiconductor laser further comprises a second confinement layer disposed above the quantum well layer so that the quantum well layer is positioned between the first confinement layer and the second confinement layer and so that the second confinement layer is positioned between the quantum well layer and the second cladding layer.

In an eighth implementation form of the first aspect or a preceding implementation form of the first aspect, the second cladding layer comprises a ridge that extends vertically.

In a ninth implementation form of the first aspect or a preceding implementation form of the first aspect, the semiconductor laser further comprises a contact layer disposed above the ridge.

In a second aspect, a method of manufacturing a semiconductor laser comprises: epitaxially growing a first cladding layer above a substrate; epitaxially growing a first confinement layer above the first cladding layer; epitaxially growing a quantum well layer above the first confinement layer; epitaxially growing a second confinement layer above the quantum well layer; epitaxially growing a second cladding layer above the second confinement layer; and epitaxially growing a first mode expansion layer within the first cladding layer, a second mode expansion layer within the second cladding layer, or both the first mode expansion layer within the first cladding layer and the second mode expansion layer within the second cladding layer.

In a first implementation form of the second aspect, the method further comprises etching away, after epitaxially growing the second mode expansion layer, a first portion of the second cladding layer and a second portion of the second mode expansion layer to form a void.

In a second implementation form of the second aspect or a preceding implementation form of the second aspect, the method further comprises: regrowing, after etching away the first portion and the second portion, the second cladding layer to fill the void; and epitaxially growing, after the regrowing, a contact layer above the second cladding layer.

In a third implementation form of the second aspect or a preceding implementation form of the second aspect, the method further comprises etching away, after epitaxially growing the contact layer, a third portion of the second cladding layer, a fourth portion of the contact layer, a fifth portion of the second cladding layer, and a sixth portion of the contact layer to form a ridge of the second cladding layer.

In a fourth implementation form of the second aspect or a preceding implementation form of the second aspect, the method further comprises etching away, after epitaxially growing the first cladding layer and before epitaxially growing the first confinement layer, a first portion of the first cladding layer and a second portion of the first mode expansion layer to form a void.

In a fifth implementation form of the second aspect or a preceding implementation form of the second aspect, the method further comprises: regrowing, after etching away the first portion and the second portion, the first cladding layer to fill the void; and epitaxially growing, after growing the second cladding layer, a contact layer above the second cladding layer.

In a sixth implementation form of the second aspect or a preceding implementation form of the second aspect, the method further comprises etching away, after epitaxially growing the contact layer, a third portion of the second cladding layer, a fourth portion of the contact layer, a fifth portion of the second cladding layer, and a sixth portion of the contact layer to form a ridge of the second cladding layer.

In a seventh implementation form of the second aspect or a preceding implementation form of the second aspect, the method further comprises etching the first mode expansion layer to form a taper structure.

In an eighth implementation form of the second aspect or a preceding implementation form of the second aspect, the method further comprises etching the second mode expansion layer to form a taper structure.

In a third aspect, a semiconductor laser comprises a first cladding layer epitaxially grown above a substrate; a first confinement layer epitaxially grown above the first cladding layer; a quantum well layer epitaxially grown above the first confinement layer; a second confinement layer epitaxially grown above the quantum well layer; a second cladding layer epitaxially grown above the second confinement layer; and a first mode expansion layer epitaxially grown within the first cladding layer, a second mode expansion layer epitaxially grown within the second cladding layer, or both the first mode expansion layer epitaxially grown within the first cladding layer and the second mode expansion layer epitaxially grown within the second cladding layer.

Any of the above embodiments may be combined with any of the other above embodiments to create a new embodiment. These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
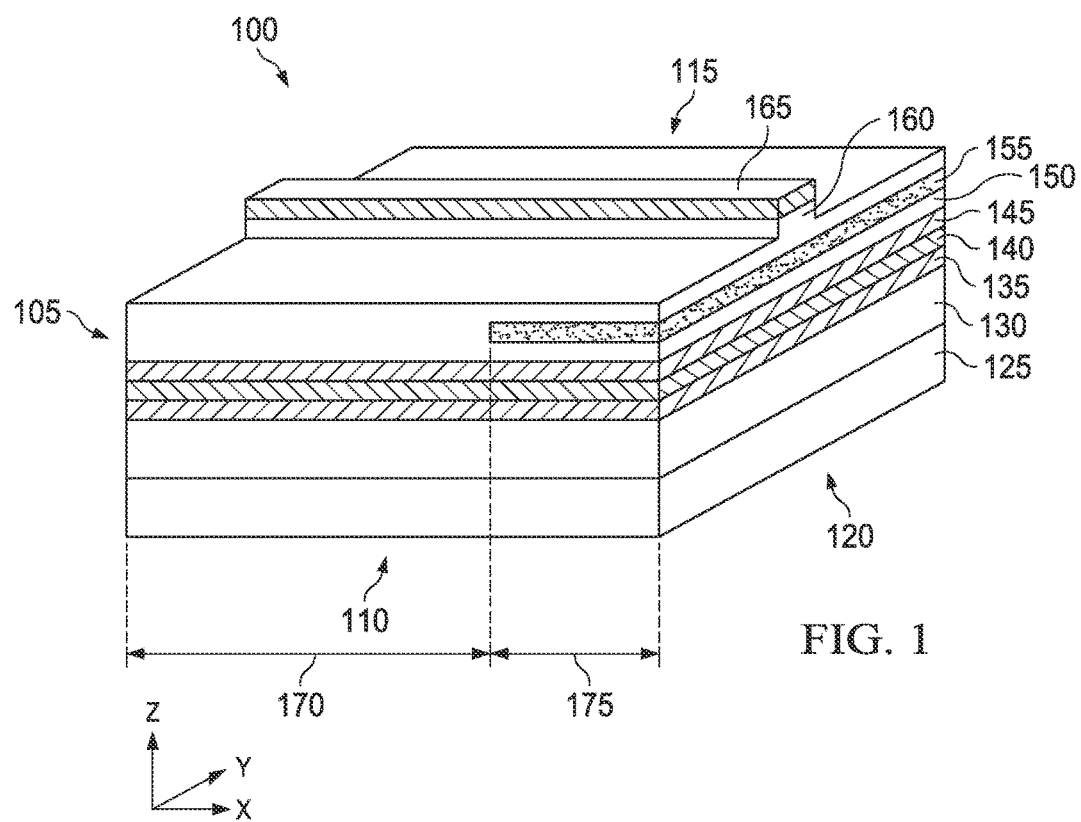
FIG. 1 is a schematic diagram of a semiconductor laser according to an embodiment.

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

The following abbreviations apply:
AlGaInAs: aluminum gallium indium arsenic
DFB: distributed feedback
FP: Fabry-Perot
GaAs: gallium arsenide
Gb/s: gigabit(s) per second
GRIN-SCH: graded index separate confinement heterostructure
InGaAs: indium gallium arsenide
InGaAsP: indium gallium arsenide phosphide
InP: indium phosphide
PON: passive optical network
μm: micrometer(s)
°: degree(s).

A frequency response of a semiconductor laser determines a modulation speed of the semiconductor laser. The frequency response, R(f), can be expressed as follows:

$$|R(f)| \propto \frac{f_r^2}{(f-f_r)^2 + \gamma^2 f^2} \cdot \frac{1}{[1+(2\pi f RC)^2]^2} \quad (1)$$

where $f_r$ is a relaxation oscillation frequency, f is a frequency, $\gamma$ is a damping coefficient, and RC is an RC time constant of the semiconductor laser. As can be seen, increasing $f_r$ increases the magnitude of R(f). The term $f_r$ can be expressed as follows:

$$f_r \propto \frac{\Gamma dg/dn}{LWN_W d_W} \cdot (I-I_{th})^{\frac{1}{2}} \quad (2)$$

where $\Gamma$ is an optical confinement factor, dg/dn is a differential gain, L is an active region length, W is an active region width, $N_w$ is a number of quantum wells, $d_w$ is a well thickness of the quantum wells, I is an injection current, and $I_{th}$ is a threshold current. Specifically, $\Gamma$ is an optical confinement factor at a specific location or cross-section of a waveguide. An average optical confinement factor computes an average $\Gamma$ across multiple locations. As can be seen, increasing $\Gamma$ increases $f_r$.

To increase the optical confinement factor $\Gamma$, the semiconductor laser may have an increased thickness of a gain material or a separated confinement structure. However, an increased confinement factor leads to an undesirable increase in the far-field angle, or divergence angle. The far-field angle includes both a horizontal far-field angle and a vertical far-field angle. An increased far-field angle makes it difficult to couple the semiconductor laser to an optical fiber. Various approaches either increase the confinement factor while undesirably increasing the far-field angle or decrease the far-field angle while undesirably decreasing the confinement factor. In addition, increased manufacturing costs often accompany those complicated approaches. It is therefore desirable to increase the confinement factors while decreasing or maintaining the far-field angle and also limiting a manufacturing cost.

Disclosed herein are embodiments for a semiconductor laser with a mode expansion layer. The mode expansion layer is in a first cladding layer, a second cladding layer, or both the first cladding layer and the second cladding layer. The mode expansion layer comprises a refractive index that is higher than a refractive index of the first cladding layer or the second cladding layer. In addition, the mode expansion layer comprises a length that is smaller than a length of the semiconductor laser. In a first portion of the semiconductor laser comprising the mode expansion layer, the mode expansion layer decreases the far-field angle of the semiconductor laser, while not significantly decreasing the average optical confinement factor of the semiconductor laser, and thus the frequency response and the modulation speed of the semiconductor laser. Specifically, the mode expansion layer may decrease a vertical far-field angle of the semiconductor laser from about 30.2° to about 24.4°. In a second portion of the semiconductor laser not comprising the mode expansion layer, the absence of the mode expansion layer maintains the average optical confinement factor of the semiconductor laser, and thus the frequency response and the modulation speed of the semiconductor laser. A manufacturer may form the mode expansion layer without using exotic fabrication. For instance, the manufacturer may use available epitaxial growth, etching, and regrowth processes. Though the semiconductor lasers that are shown and described are FP lasers, the semiconductor lasers may also be DFB lasers with grating layers below bottom cladding layers or above top cladding layers.

FIG. 1 is a schematic diagram of a semiconductor laser 100 according to an embodiment. The semiconductor laser 100 comprises a back facet 105 that generally faces to the left of the page and is not visible, a side facet 110 that faces the front of the page, a side facet 115 that faces the back of the page and is not visible, and a front facet 120 that generally faces the right of the page and is visible. The semiconductor laser 100 further comprises a substrate 125, a cladding layer 130, a confinement layer 135, a quantum well layer 140, a confinement layer 145, a cladding layer 150, a mode expansion layer 155, a ridge 160, and a contact layer 165. In response to a current, the semiconductor laser 100 emits an optical beam away from the front facet 120 in a direction about perpendicular to the front facet 120.

The semiconductor laser 100 and its components have a length in the x direction, a width in the y direction, and a height in the z direction. The length of the semiconductor laser 100 may be about 150-1,500 µm. The width of the semiconductor laser 100 may be about 150-1,000 µm. The height of the semiconductor laser 100 may be about 100-200 µm.

The substrate 125 is n+ doped; comprises InP, GaAs, or another suitable material; and provides a structure to support and grow other layers on. The cladding layer 130 is n doped, comprises InP or another suitable material, and comprises a refractive index that is lower than other non-cladding layers in order to provide optical confinement. The confinement layer 135 comprises InGaAsP, AlGaInAs, or another suitable material; comprises a GRIN-SCH that provides electrical confinement and further optical confinement; and may have a height of about 20 µm-120 µm.

The quantum well layer 140 is an active layer; comprises InGaAsP, AlGaInAs, or another suitable material; and comprises quantum wells that provide optical gain. The confinement layer 145 comprises InGaAsP, AlGaInAs, or another suitable material; comprises the GRIN-SCH; and may have a height of about 20 µm-120 µm. The cladding layer 150 is p doped, comprises InP or another suitable material, and comprises a refractive index that is lower than other non-cladding layers in order to provide optical confinement. The refractive index of the cladding layer 150 may be about 3.3-3.5. The mode expansion layer 155 is described below.

The ridge 160 is a portion of the cladding layer 150 that extends vertically in the z direction, defines a waveguide for the optical beam, and may have a width of about 1 µm-2 µm. Thus, the semiconductor laser 100 may be referred to as a ridge waveguide semiconductor laser. Alternatively, the semiconductor laser 100 is a buried heterostructure semiconductor laser. The contact layer 165 is p+ doped, comprises InGaAs or another suitable material, receives an electrical signal from an external source, and modulates light to create the optical beam.

The mode expansion layer 155 is disposed within the cladding layer 150 so that the cladding layer 150 is both below and above the mode expansion layer 155 in the z direction. The mode expansion layer 155 is a passive layer, is p doped, comprises InGaAsP or another suitable material, comprises a refractive index that is higher than the refractive index of the cladding layer 150, expands an optical mode of the optical beam, and shapes the far-field angle of the semiconductor laser 100. The refractive index of the mode expansion layer 155 may be about 3.4-3.6. A manufacturer forms the mode expansion layer 155 using planar fabrication techniques, so the mode expansion layer 155 is relatively simple and inexpensive to fabricate.

As shown, the mode expansion layer 155 extends fully across the width of the semiconductor laser 100. The mode expansion layer 155 does not extend fully across the length of the semiconductor laser 100. Specifically, the mode expansion layer 155 extends across a first length 175 of the semiconductor laser 100 from the front facet 120 towards, but not to, the back facet 105; and the mode expansion layer 155 does not extend across a second length 170 of the semiconductor laser 100 from the back facet 105 towards, but not to, the front facet 120.

In a first portion of the semiconductor laser 100 corresponding to the first length 175, the mode expansion layer 155 decreases the far-field angle of the semiconductor laser 100, while not significantly decreasing the average optical confinement factor of the semiconductor laser 100, and thus the frequency response and the modulation speed of the semiconductor laser 100. The mode expansion layer 155 may particularly decrease the vertical far-field angle of the semiconductor laser 100, which is typically larger and more problematic than the horizontal far-field angle of the semiconductor laser 100. For instance, the mode expansion layer 155 may decrease the vertical far-field angle of the semiconductor laser 100 from about 30.2° to about 24.4°. In a second portion of the semiconductor laser 100 corresponding to the second length 170, the mode expansion layer 155 is not present, and its absence maintains the average optical confinement factor of the semiconductor laser 100, and thus the frequency response and the modulation speed of the semiconductor laser 100.

Increasing both a length of the mode expansion layer 155, which is the same as the first length 175 of the semiconductor laser 100, and a height of the mode expansion layer 155 decreases the far-field angle of the semiconductor laser 100. The length of the mode expansion layer 155 may be about 30 μm-50 μm or about 30 μm-80 μm. The height of the mode expansion layer 155 may be about 30 μm-100 μm.

The manufacturer may design dimensions of the components of the semiconductor laser 100, including the length of the mode expansion layer 155, the height of the mode expansion layer 155, the height of the confinement layer 135 and the confinement layer 145, and the width of the ridge 160, based on various metrics. Those metrics include the far-field angle, optical confinement factor or average optical confinement factor, frequency response, and modulation speed of the semiconductor laser 100. The manufacturer may seek a desirable value or range for any combination of those metrics. For instance, the manufacturer designs the length of the mode expansion layer 155 and the height of the mode expansion layer 155 to achieve a desired frequency response and a desired far-field angle of the semiconductor laser 100. In one example, the length of the mode expansion layer 155 is about 50 μm, and the height of the mode expansion layer 155 is about 40 μm. In addition, the height of the confinement layers 135, 145 is about 30 μm; and the width of the ridge 160 is about 2 μm.

Figure 2A:
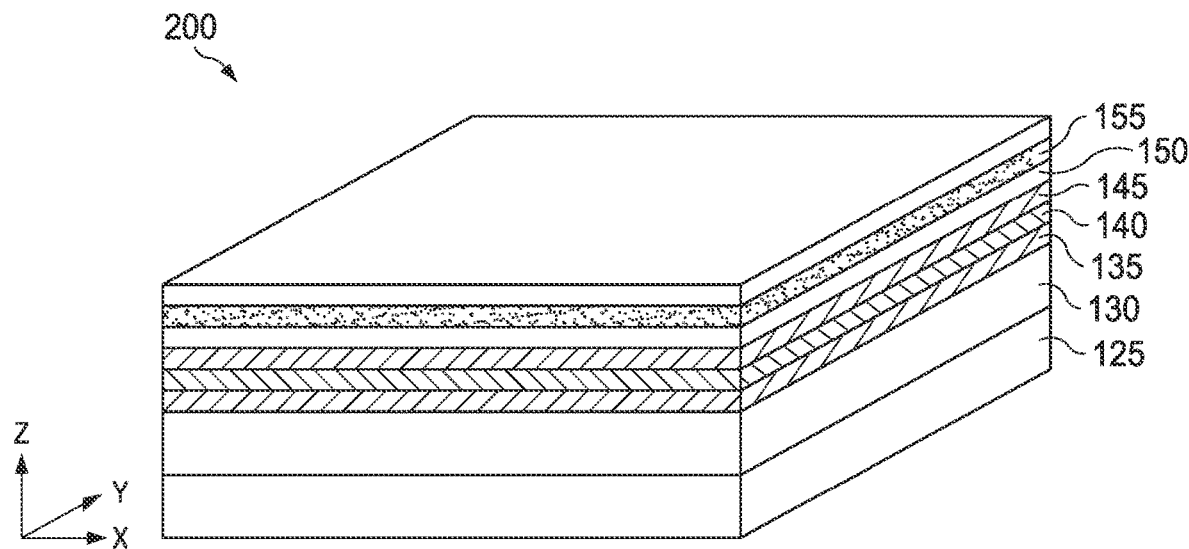
FIGS. 2A-2D show a fabrication process of the semiconductor laser in FIG. 1.

FIGS. 2A-2D show a fabrication process of the semiconductor laser 100 in FIG. 1. FIG. 2A is a schematic diagram 200 of the semiconductor laser 100 after an epitaxial growth. A manufacturer begins with the substrate 125. The manufacturer epitaxially grows the cladding layer 130 on top of the substrate 125, the confinement layer 135 on top of the cladding layer 130, the quantum well layer 140 on top of the confinement layer 135, the confinement layer 145 on top of the quantum well layer 140, and the cladding layer 150 on top of the confinement layer 145. Within the cladding layer 150, the manufacturer epitaxially grows the mode expansion layer 155.

Figure 2B:
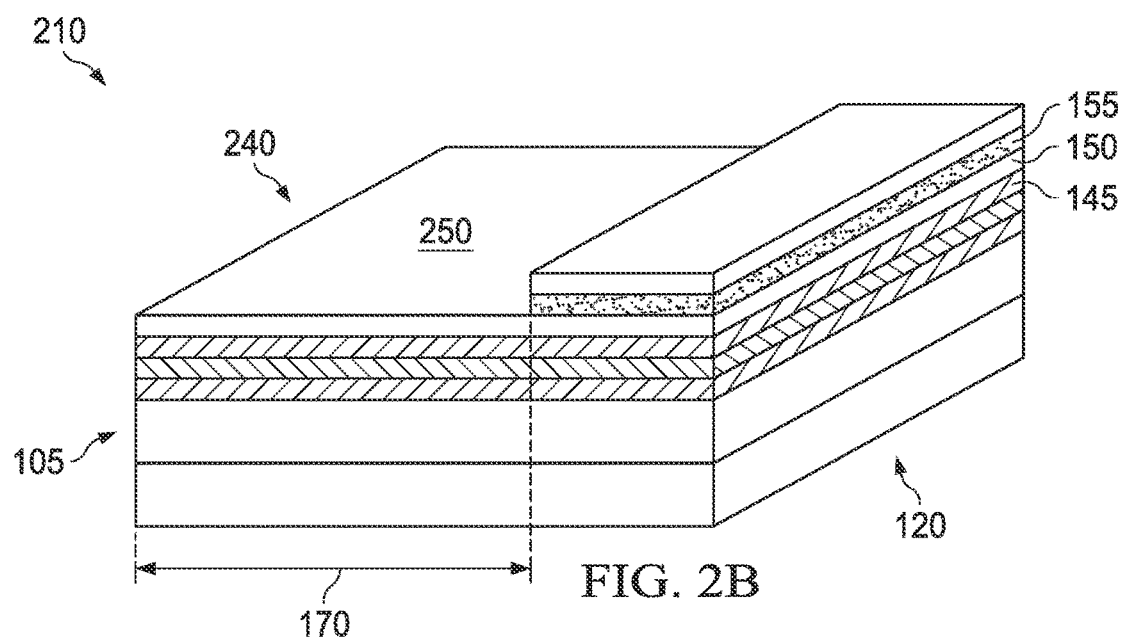

FIG. 2B is a schematic diagram 210 of the semiconductor laser 100 after a first etching. The manufacturer etches away a portion of the cladding layer 150 and the mode expansion layer 155 to form a void 240. The void 240 extends across the width of the semiconductor laser 100 and extends from the back facet 105 towards the front facet 120 across the second length 170. The void 240 further extends from a top of the semiconductor laser 100 towards, but not to, the confinement layer 145, thus leaving a sub-layer 250 of the cladding layer 150 below the void 240. The sub-layer 250 is relatively thin and may have a height of about 20 μm-40 μm. The etching is wet etching or dry etching.

Figure 2C:
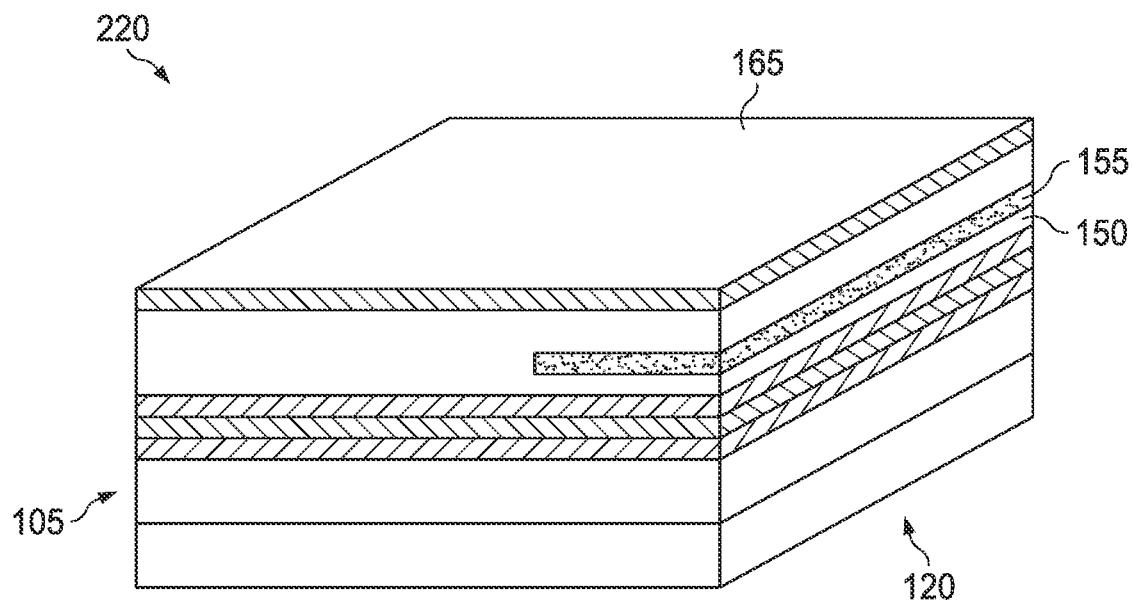

FIG. 2C is a schematic diagram 220 of the semiconductor laser 100 after a regrowth. The manufacturer regrows the cladding layer 150 to fill the void 240. Upon the regrowth, the cladding layer 150 does not include the mode expansion layer 155 where the void 240 existed. In addition, the manufacturer epitaxially grows the contact layer 165 on top of the cladding layer 150.

Figure 2D:
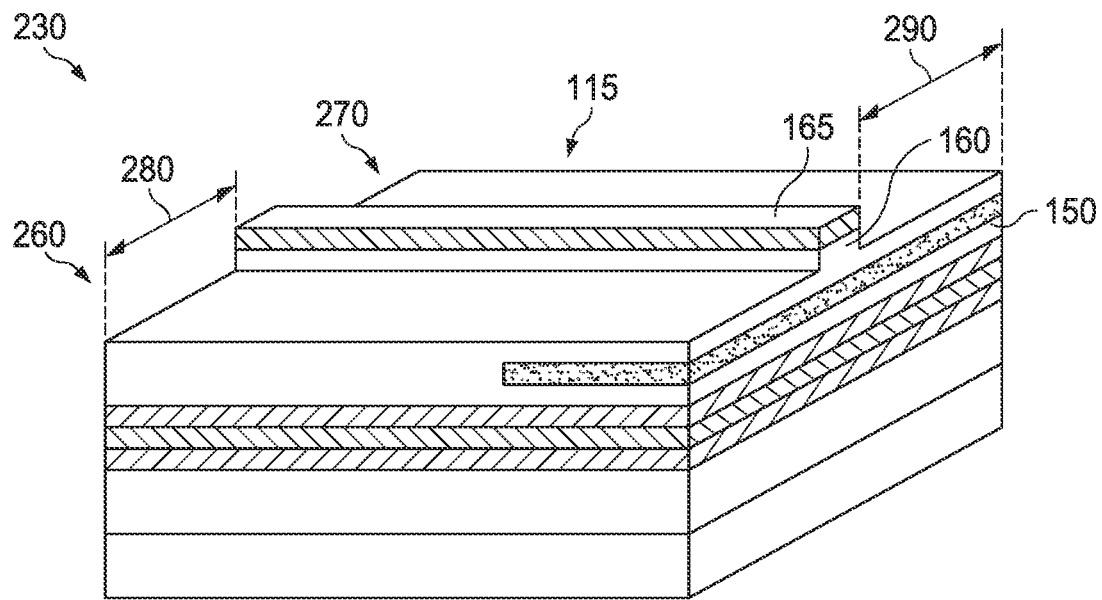

FIG. 2D is a schematic diagram 230 of the semiconductor laser 100 after a second etching. The manufacturer etches away a portion of the cladding layer 150 and a portion of the contact layer 165 to form a first void 260 that extends from the side facet 110 towards a middle of the semiconductor laser 100 across a width 280; and the manufacturer etches away a portion of the cladding layer 150 and a portion of the contact layer 165 to form a second void 270 that extends from the side facet 115 to the middle of the semiconductor laser 100 across a width 290. In so doing, the manufacturer forms the ridge 160.

Figure 3:
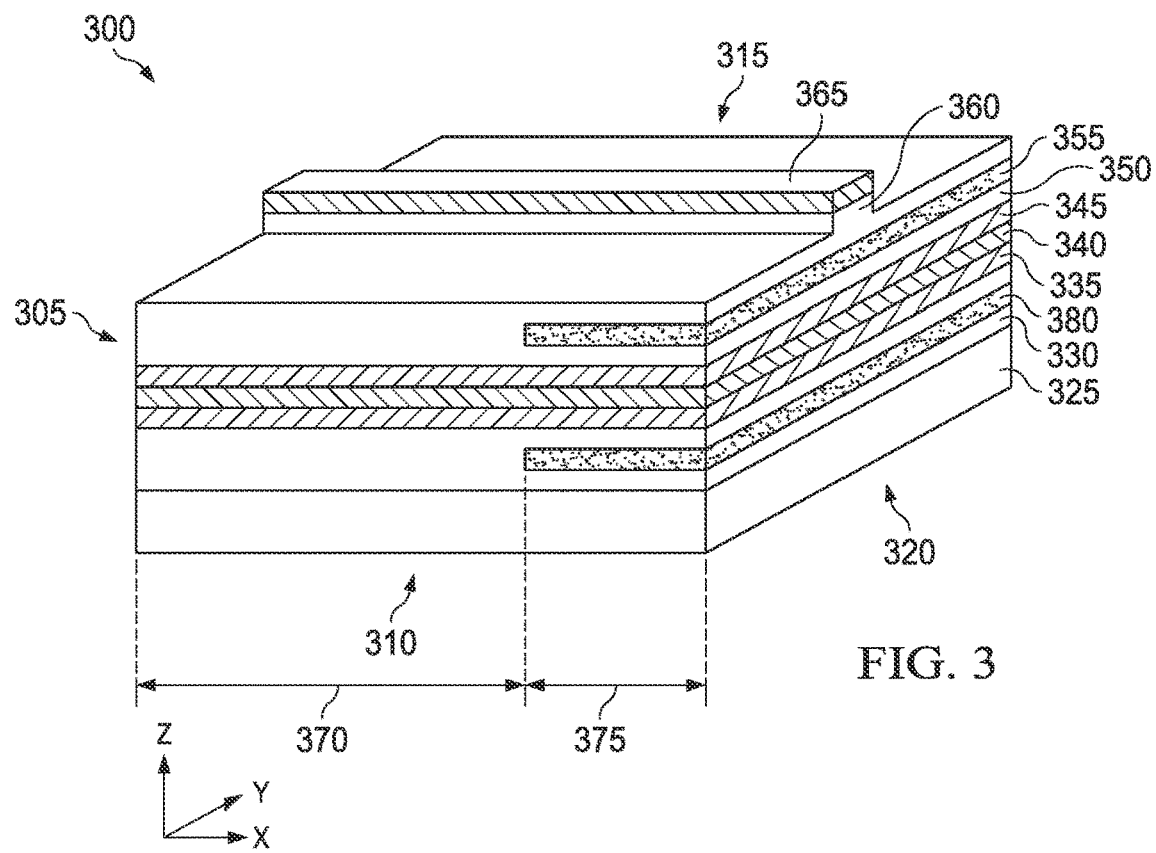
FIG. 3 is a schematic diagram of a semiconductor laser according to another embodiment.

FIG. 3 is a schematic diagram of a semiconductor laser 300 according to another embodiment. The semiconductor laser 300 is similar to the semiconductor laser 100. Specifically, the semiconductor laser 300 comprises a back facet 305, a side facet 310, a side facet 315, and a front facet 320 that are similar to the back facet 105, the side facet 110, the side facet 115, and the front facet 120, respectively. In addition, the semiconductor laser 300 further comprises a substrate 325, a cladding layer 330, a confinement layer 335, a quantum well layer 340, a confinement layer 345, cladding layer 350, an mode expansion layer 355, a ridge 360, and a contact layer 365 that are similar to the substrate 125, the cladding layer 130, the confinement layer 135, the quantum well layer 140, the confinement layer 145, the cladding layer 150, the mode expansion layer 155, the ridge 160, and the contact layer 165, respectively.

However, unlike the semiconductor laser 100, the semiconductor laser 300 comprises a mode expansion layer 380 within the cladding layer 330. The mode expansion layer 380 has a composition, a functionality, and dimensions similar to the mode expansion layer 355, and thus the mode expansion layer 380 comprises a refractive index that is higher than the refractive index of the cladding layer 330. The refractive index of the cladding layer 330 may be about 3.3-3.5, and the refractive index of the mode expansion layer 380 may be about 3.4-3.6. Together, the mode expansion layers 355, 380 decrease the far-field angle of the semiconductor laser 300, while not significantly decreasing the average optical confinement factor of the semiconductor laser 300, and thus the frequency response and the modulation speed of the semiconductor laser 300. Though the mode expansion layers 355, 380 are shown having a same length extending across a first length 375 of the semiconductor laser 300, but not a second length 370 of the semiconductor laser 300, the mode expansion layers 355, 380 may have different lengths. A manufacturer may design those lengths based on the metrics described above, for instance, to achieve a desired frequency response and a desired far-field angle.

Figure 4A:
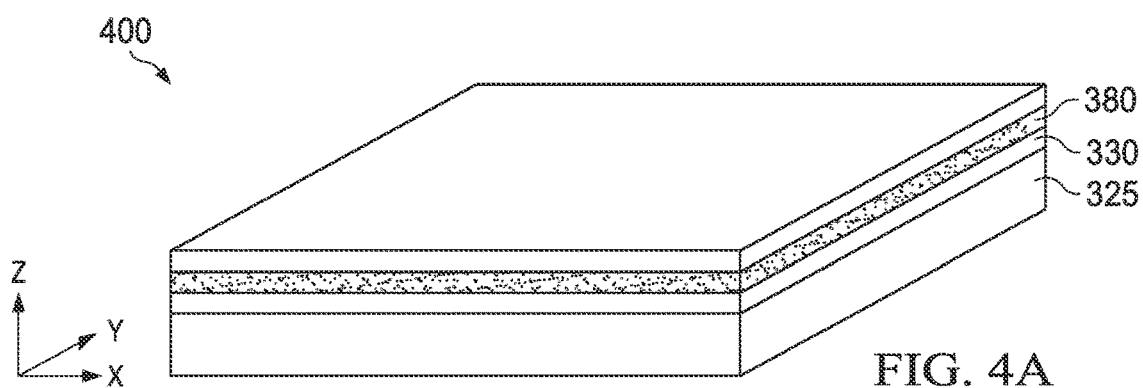
FIGS. 4A-4F show a fabrication process of the semiconductor laser in FIG. 3.

FIGS. 4A-4F show a fabrication process of the semiconductor laser 300 in FIG. 3. FIG. 4A is a schematic diagram 400 of the semiconductor laser 300 after an epitaxial growth. A manufacturer begins with the substrate 325. On top of the substrate 325, the manufacturer epitaxially grows the cladding layer 330. Within the cladding layer 330, the manufacturer epitaxially grows the mode expansion layer 380.

Figure 4B:
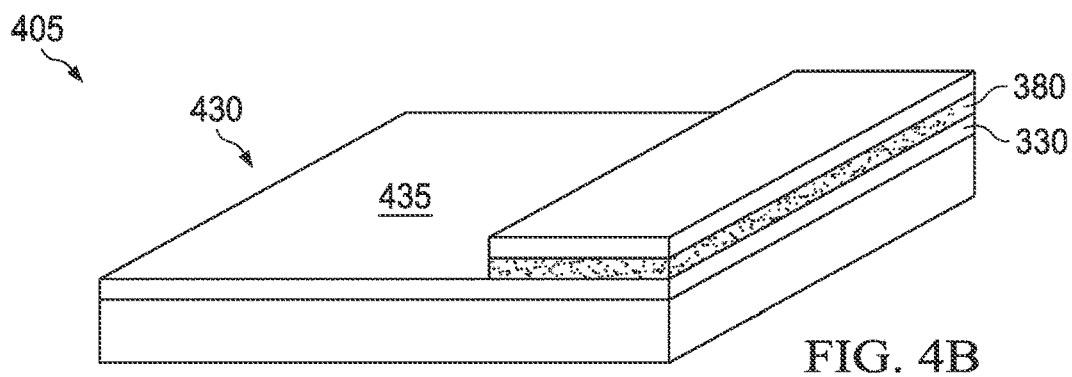

FIG. 4B is a schematic diagram 405 of the semiconductor laser 300 after a first etching. The manufacturer etches away a portion of the cladding layer 330 and the mode expansion layer 380 to form a void 430. The void 430 extends across the width of the semiconductor laser 300 and extends from the back facet 305 towards the front facet 320 across the second length 370. The void 430 further extends from a top of the semiconductor laser 300 towards, but not to, the substrate 325, thus leaving a sub-layer 435 of the cladding layer 330 below the void 430. The sub-layer 435 is relatively thin and may have a height of about 20 μm-40 μm. The etching is wet etching or dry etching.

Figure 4C:
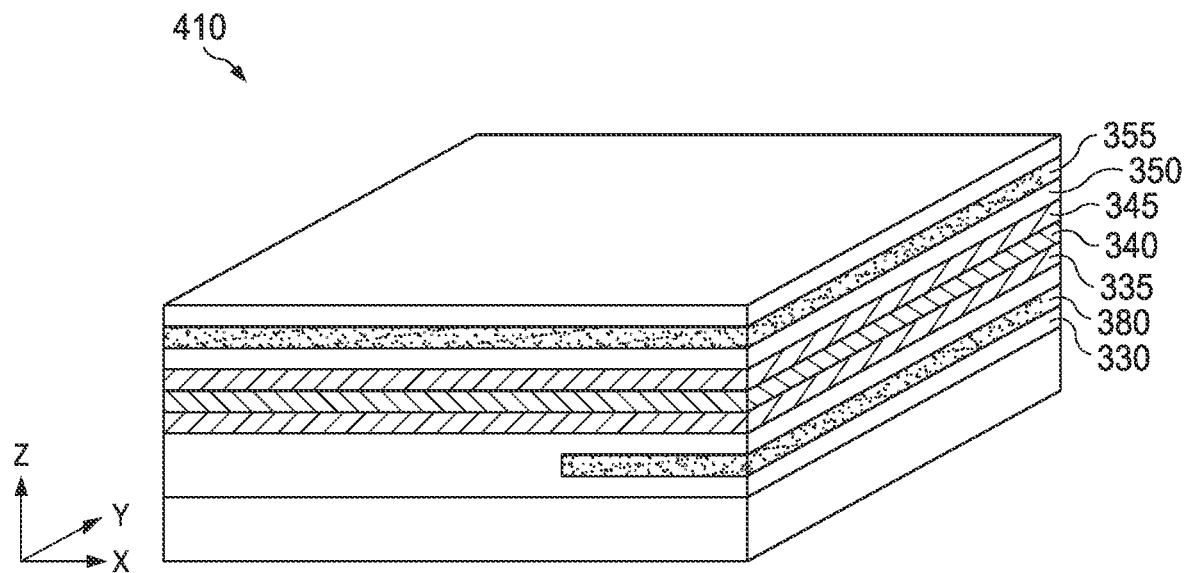

FIG. 4C is a schematic diagram 410 of the semiconductor laser 300 after a first regrowth. The manufacturer regrows the cladding layer 330 to fill the void 430. Upon the regrowth, the cladding layer 330 does not include the mode expansion layer 380 where the void 430 existed. In addition, the manufacturer epitaxially grows the confinement layer 335 on top of the cladding layer 330, the quantum well layer 340 on top of the confinement layer 335, the confinement layer 345 on top of the quantum well layer 340, and the cladding layer 350 on top of the confinement layer 345. Within the cladding layer 350, the manufacturer epitaxially grows the mode expansion layer 355.

Figure 4D:
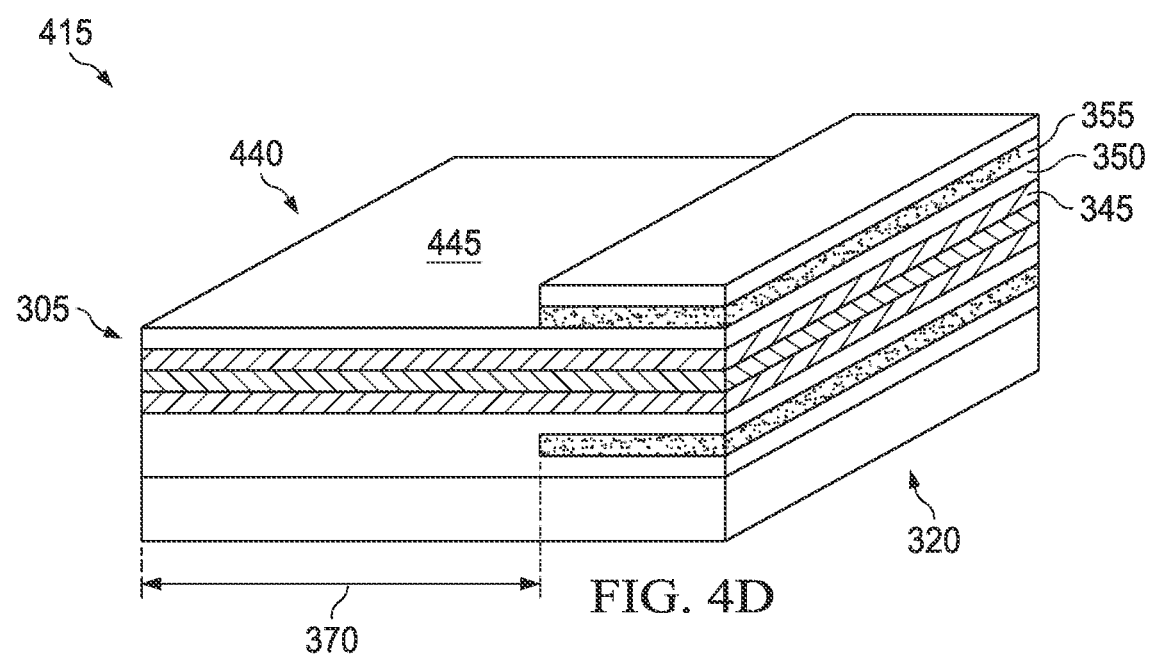

FIG. 4D is a schematic diagram 415 of the semiconductor laser 300 after a second etching. The manufacturer etches away a portion of the cladding layer 350 and the mode expansion layer 355 to form a void 440. The void 440 extends across the width of the semiconductor laser 300 and extends from the back facet 305 towards the front facet 320 across the second length 370. The void 440 further extends from a top of the semiconductor laser 300 towards, but not to, the confinement layer 345, thus leaving a sub-layer 445 of the cladding layer 350 below the void 440. The sub-layer 445 is relatively thin and may have a height of about 20 μm-40 μm. The etching is wet etching or dry etching.

Figure 4E:
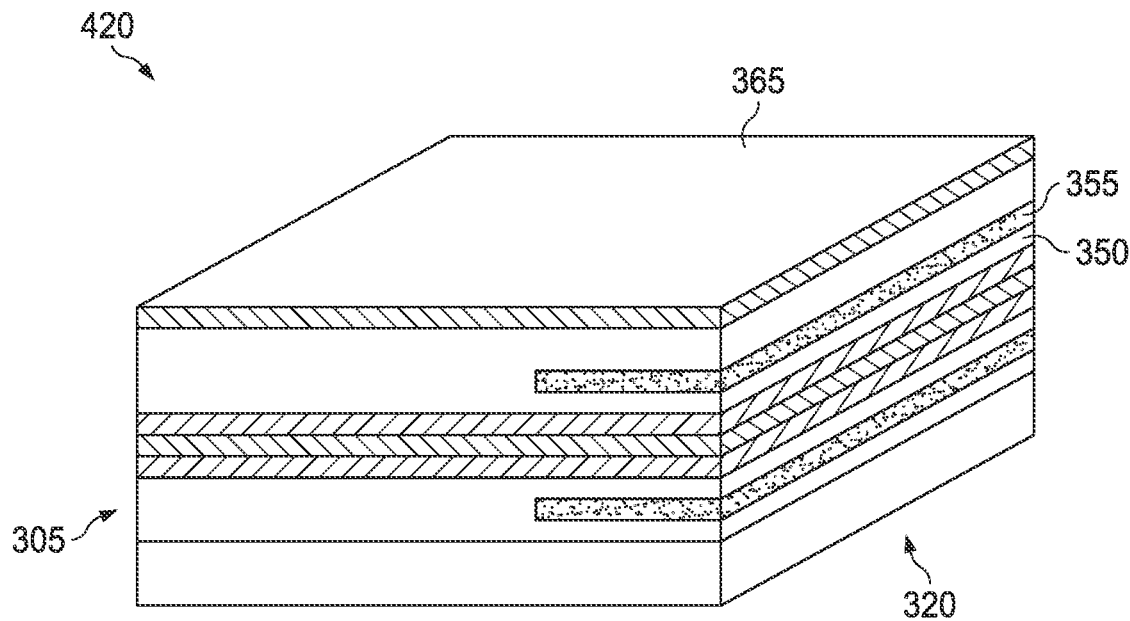

FIG. 4E is a schematic diagram 420 of the semiconductor laser 300 after a second regrowth. The manufacturer regrows the cladding layer 350 to fill the void 440. Upon the regrowth, the cladding layer 350 does not include the mode expansion layer 355 where the void 440 existed. In addition, the manufacturer epitaxially grows the contact layer 365 on top of the cladding layer 350.

Figure 4F:
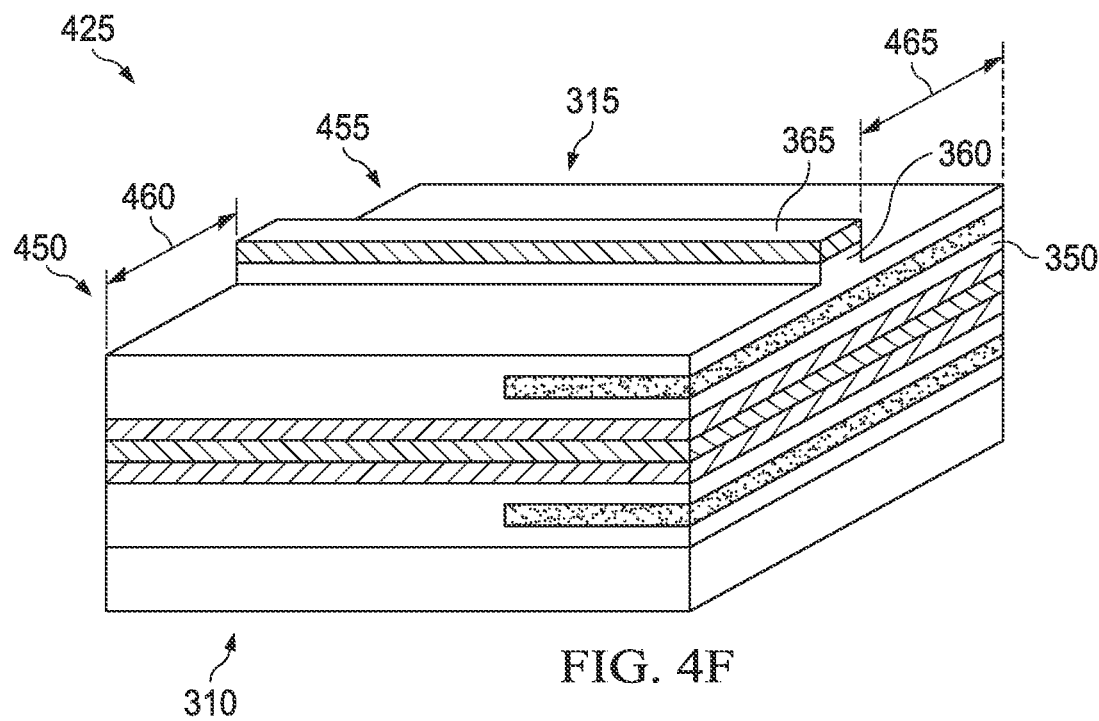

FIG. 4F is a schematic diagram 425 of the semiconductor laser 300 after a third etching. The manufacturer etches away a portion of the cladding layer 350 and a portion of the contact layer 365 to form a first void 450 that extends from the side facet 310 towards a middle of the semiconductor laser 300 across a width 460; and the manufacturer etches away a portion of the cladding layer 350 and a portion of the contact layer 365 to form a second void 455 that extends from the side facet 315 to the middle of the semiconductor laser 300 across a width 465. In so doing, the manufacturer forms the ridge 360.

Figure 5:
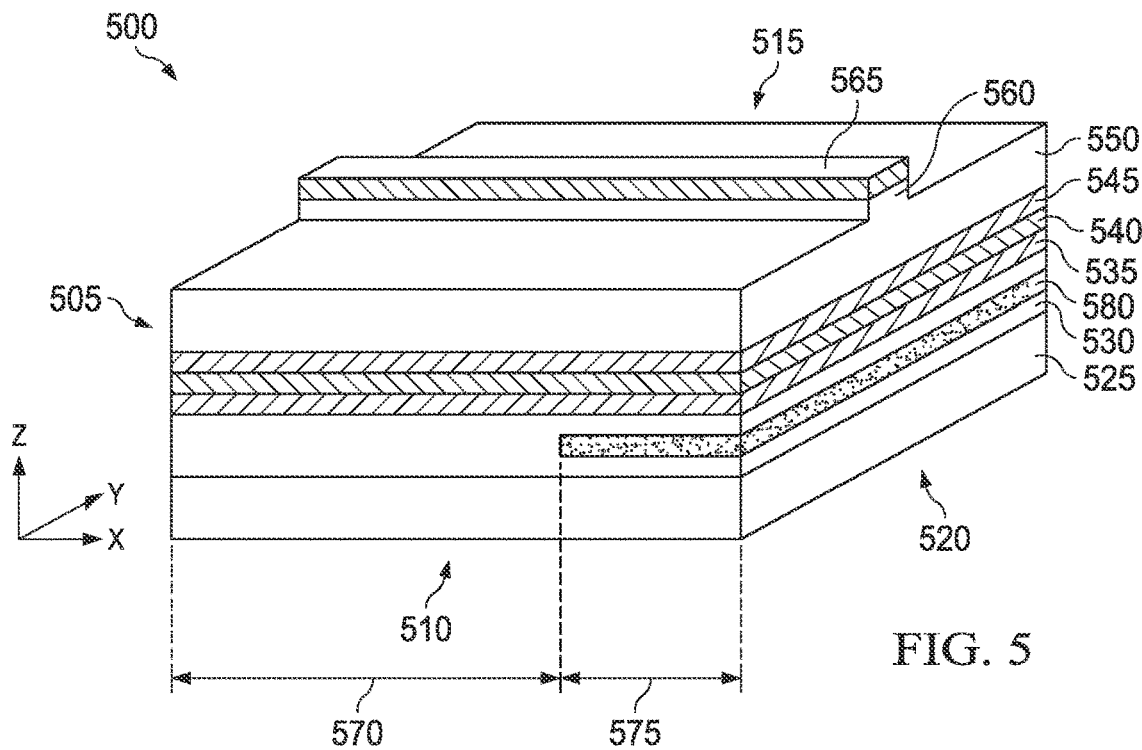
FIG. 5 is a schematic diagram of a semiconductor laser according to yet another embodiment.

FIG. 5 is a schematic diagram of a semiconductor laser 500 according to yet another embodiment. The semiconductor laser 500 is similar to the semiconductor laser 100. Specifically, the semiconductor laser 500 comprises a back facet 505, a side facet 510, a side facet 515, and a front facet 520 that are similar to the back facet 105, the side facet 110, the side facet 115, and the front facet 120, respectively. In addition, the semiconductor laser 500 further comprises a substrate 525, a cladding layer 530, a confinement layer 535, a quantum well layer 540, a confinement layer 545, a cladding layer 550, a ridge 560, and a contact layer 565 that are similar to the substrate 125, the cladding layer 130, the confinement layer 135, the quantum well layer 140, the confinement layer 145, the cladding layer 150, the ridge 160, and the contact layer 165, respectively.

However, unlike the semiconductor laser 100, in which the cladding layer 150 comprises the mode expansion layer 155, the semiconductor laser 500 comprises a mode expansion layer 580 within the cladding layer 530. The mode expansion layer 580 has a composition, a functionality, and dimensions similar to the mode expansion layer 155. The mode expansion layer 580 comprises a refractive index that is higher than the refractive index of the cladding layer 530. The refractive index of the cladding layer 530 may be about 3.3-3.5, and the refractive index of the mode expansion layer 580 may be about 3.4-3.6. The mode expansion layer 580 decreases the far-field angle of the semiconductor laser 500, while not significantly decreasing the average optical confinement factor of the semiconductor laser 500, and thus the frequency response and the modulation speed of the semiconductor laser 500. A manufacturer may design the length of the mode expansion layer 580 based on the metrics described above, for instance, to achieve a desired frequency response and a desired far-field angle.

Figure 6A:
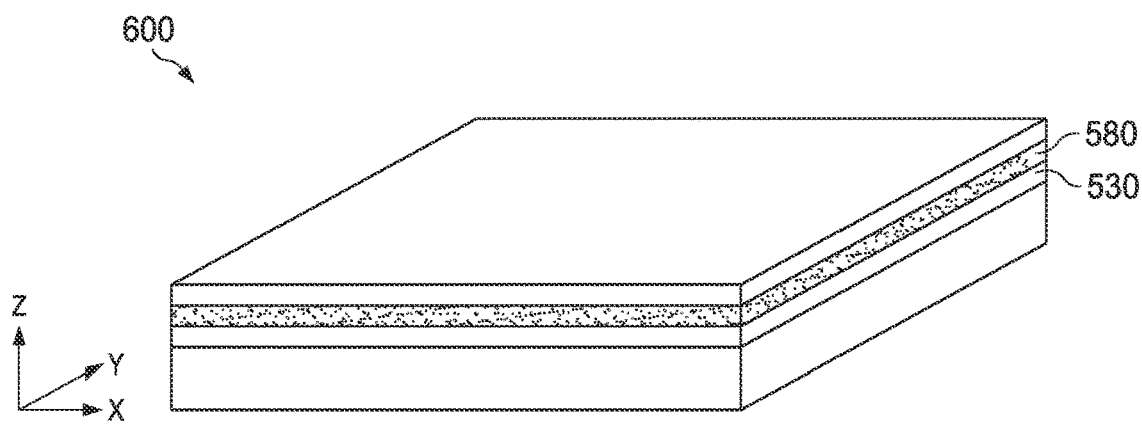
FIGS. 6A-6D show a fabrication process of the semiconductor laser in FIG. 5.

FIGS. 6A-6D show a fabrication process of the semiconductor laser 500 in FIG. 5. FIG. 6A is a schematic diagram 600 of the semiconductor laser 500 after an epitaxial growth. A manufacturer begins with the substrate 525. On top of the substrate 525, the manufacturer epitaxially grows the cladding layer 530. Within the cladding layer 530, the manufacturer epitaxially grows the mode expansion layer 580.

Figure 6B:
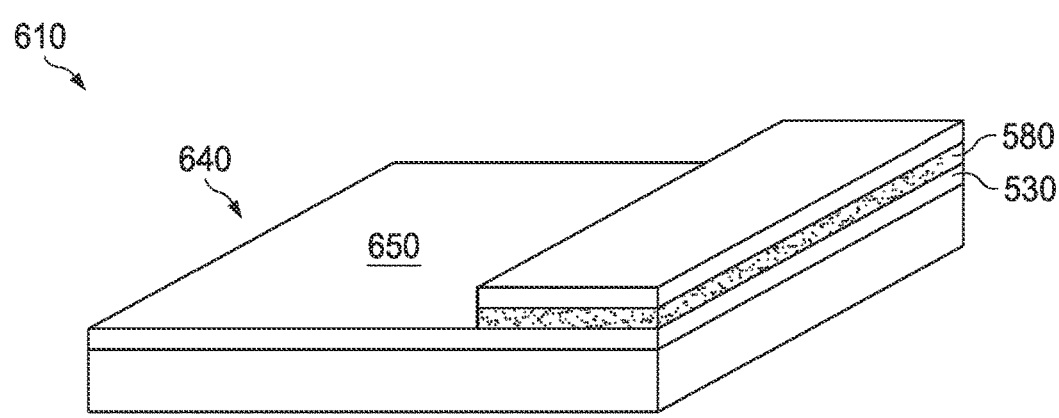

FIG. 6B is a schematic diagram 610 of the semiconductor laser 500 after a first etching. The manufacturer etches away a portion of the cladding layer 530 and the mode expansion layer 580 to form a void 640. The void 640 extends across the width of the semiconductor laser 500 and extends from the back facet 505 towards the front facet 520 across the second length 570. The void 640 further extends from a top of the semiconductor laser 500 towards, but not to, the substrate 525, thus leaving a sub-layer 650 of the cladding layer 530 below the void 640. The sub-layer 650 is relatively thin and may have a height of about 20 μm-40 μm. The etching is wet etching or dry etching.

Figure 6C:
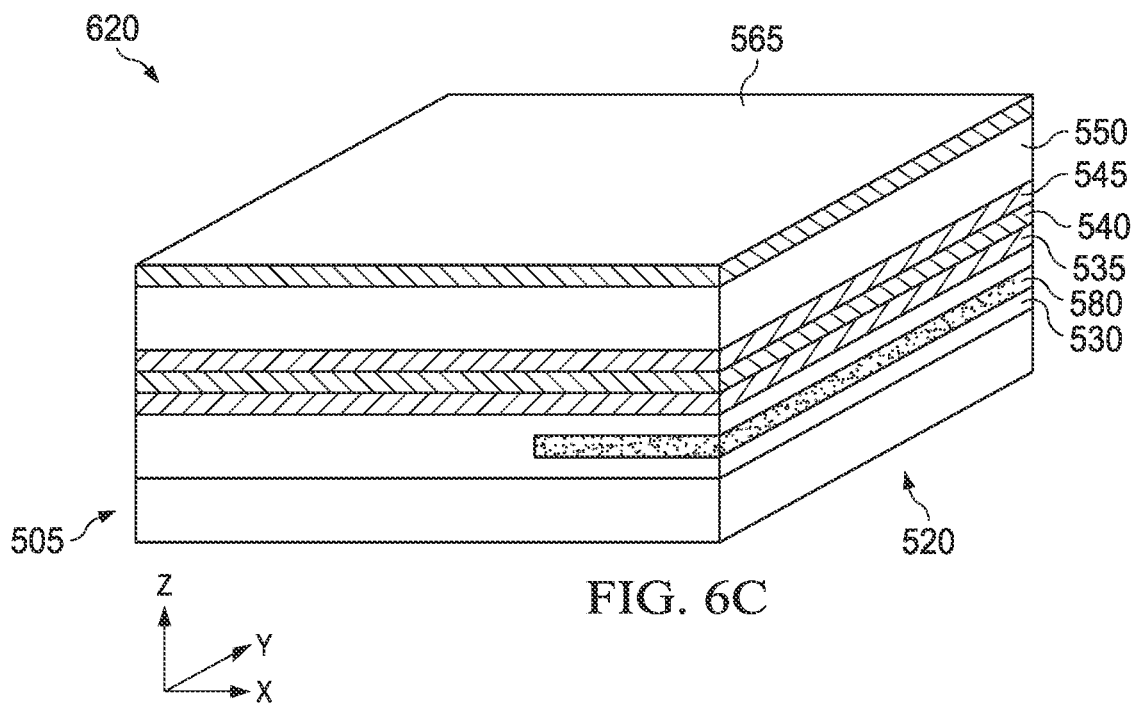

FIG. 6C is a schematic diagram 620 of the semiconductor laser 500 after a regrowth. The manufacturer regrows the cladding layer 530 to fill the void 640. Upon the regrowth, the cladding layer 530 does not include the mode expansion layer 580 where the void 640 existed. In addition, the manufacturer epitaxially grows the confinement layer 535 on top of the cladding layer 530, the quantum well layer 540 on top of the confinement layer 535, the confinement layer 545 on top of the quantum well layer 540, the cladding layer 550 on top of the confinement layer 545, and the contact layer 565 on top of the cladding layer 550.

Figure 6D:
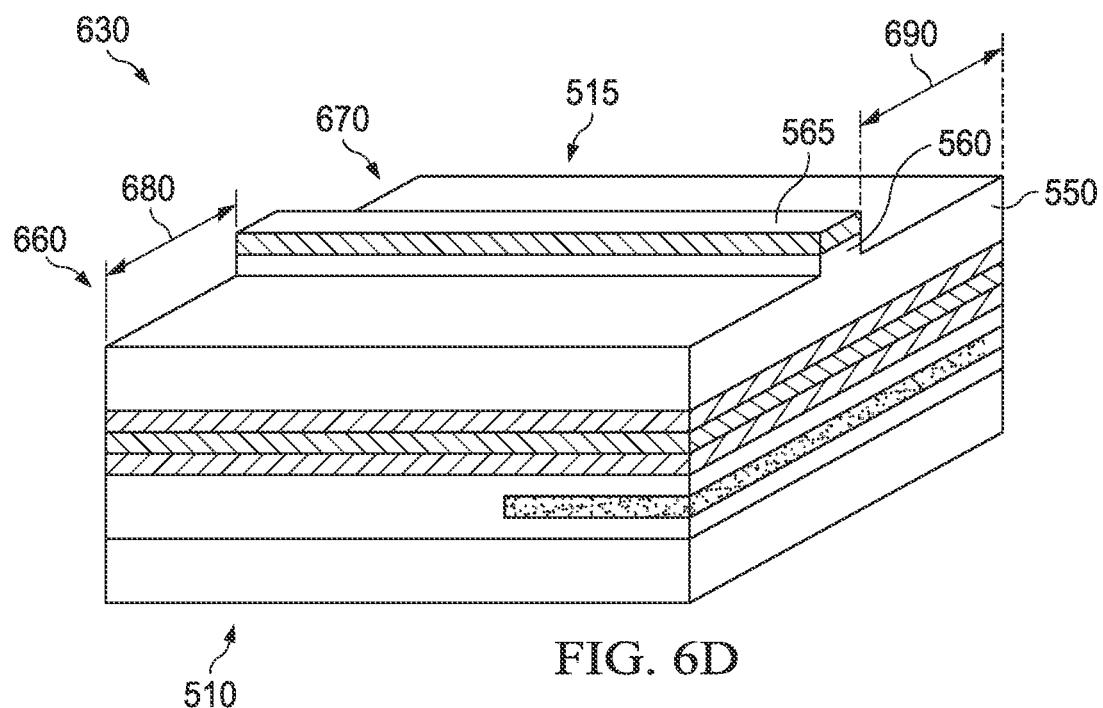

FIG. 6D is a schematic diagram 630 of the semiconductor laser 500 after a second etching. The manufacturer etches away a portion of the cladding layer 550 and a portion of the contact layer 565 to form a first void 660 that extends from the side facet 510 towards a middle of the semiconductor laser 500 across a width 680; and the manufacturer etches away a portion of the cladding layer 550 and a portion of the contact layer 565 to form a second void 670 that extends from the side facet 515 to the middle of the semiconductor laser 500 across a width 690. In so doing, the manufacturer forms the ridge 560.

Figure 7:
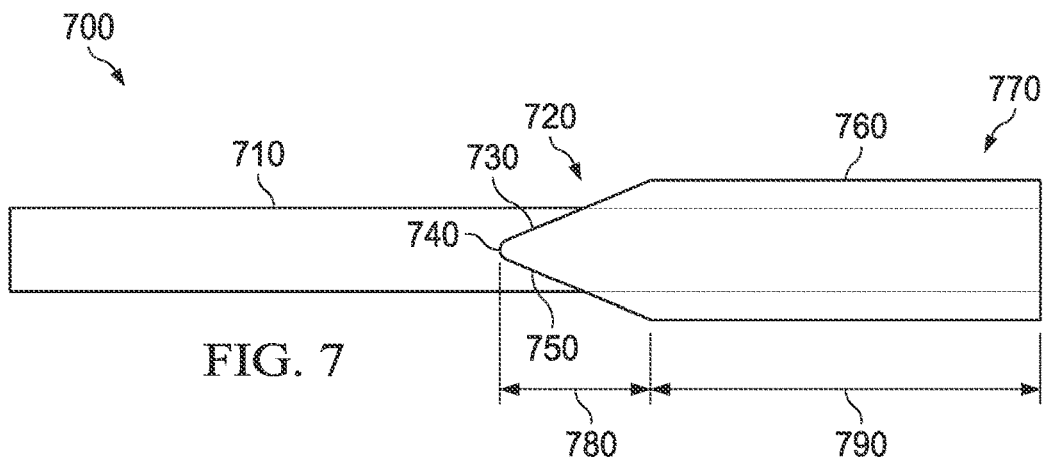
FIG. 7 is a top view of a portion of a semiconductor laser according to an embodiment.

FIG. 7 is a top view of a portion 700 of a semiconductor laser according to an embodiment. The portion 700 comprises a ridge 710 and a mode expansion layer 760. The ridge 710 may be the ridge 160, 360, or 560, and the mode expansion layer 760 may be the mode expansion layer 155, 380, 555, or 580. The ridge 710 is substantially rectangular and is positioned above the mode expansion layer 760.

The mode expansion layer 760 comprises a first portion 720 across a first length 780 and a second portion 770 across a second length 790. The first portion 720 is substantially triangular or trapezoidal and comprises a taper 730, a tip 740, and a taper 750. The taper 730, the tip 740, and the taper 750 form a taper structure that reduces coupling loss and reflection of an optical beam. The manufacturer may use wet etching or dry etching to form the taper structure. The second portion 770 is substantially rectangular.

Figure 8:
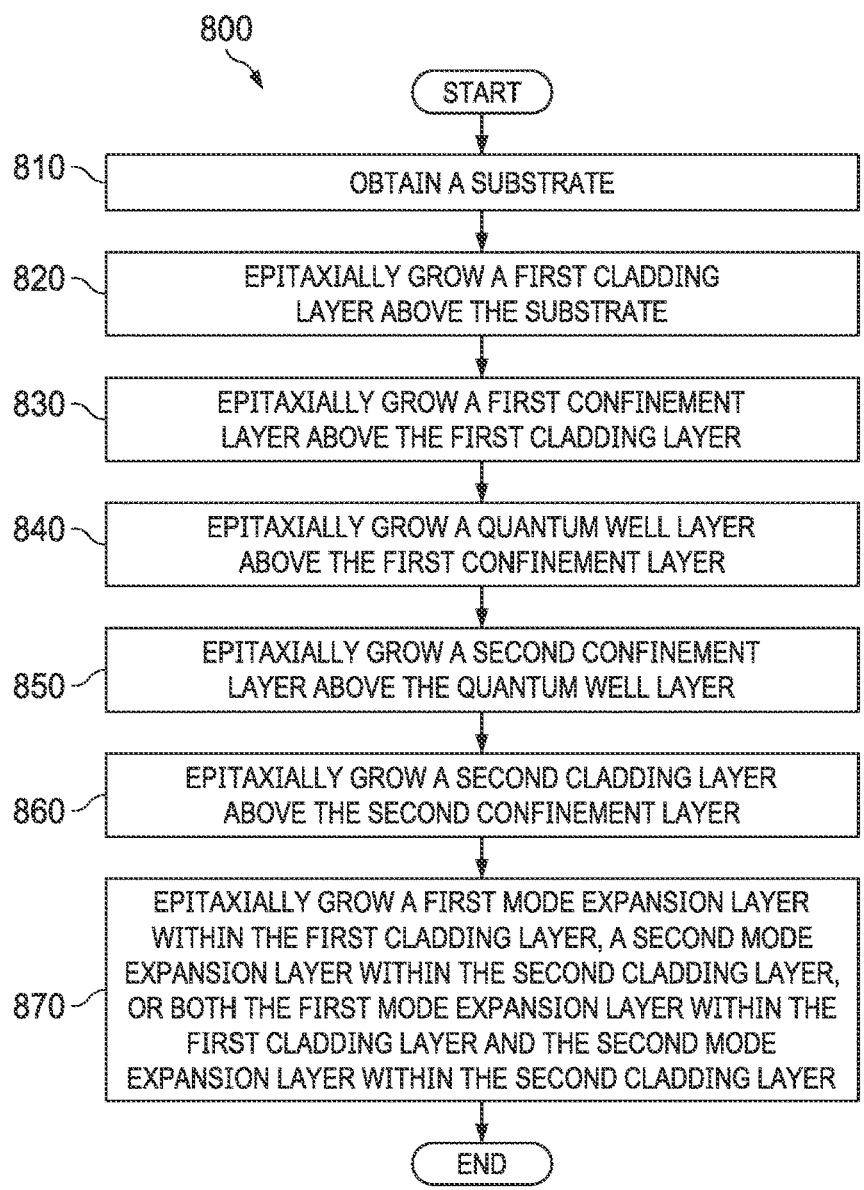
FIG. 8 is a flowchart illustrating a method of making a semiconductor laser according to an embodiment.

FIG. 8 is a flowchart illustrating a method 800 of making a semiconductor laser according to an embodiment. A manufacturer may implement the method 800 to make the semiconductor laser 100, 300, or 500. At step 810, a substrate is obtained. For instance, the manufacturer obtains the substrate 125, 325, or 525.

At step 820, a first cladding layer is epitaxially grown above the substrate. For instance, the manufacturer epitaxially grows the cladding layer 130, 330, or 530. At step 830, a first confinement layer is epitaxially grown above the first cladding layer. For instance, the manufacturer epitaxially grows the confinement layer 135, 335, or 535.

At step 840, a quantum well layer is epitaxially grown above the first confinement layer. For instance, the manufacturer epitaxially grows the quantum well layer 140, 340, or 540. At step 850, a second confinement layer is epitaxially grown above the quantum well layer. For instance, the manufacturer epitaxially grows the confinement layer 145, 345, or 545.

At step 860, a second cladding layer is epitaxially grown above the second confinement layer. For instance, the manufacturer epitaxially grows the cladding layer 150, 350, or 550. Finally, at step 870, a first mode expansion layer is epitaxially grown within the first cladding layer, a second mode expansion layer is epitaxially grown within the second cladding layer, or both the first mode expansion layer is epitaxially grown within the first cladding layer and the second mode expansion layer is epitaxially grown within the second cladding layer. For instance, the manufacturer epitaxially grows the mode expansion layer 580 within the cladding layer 530, the mode expansion layer 155 within the cladding layer 150, or both the mode expansion layer 380 within the cladding layer 330 and the mode expansion layer 355 within the cladding layer 350.

The method 800 may comprise additional steps. In a first embodiment, after epitaxially growing the second mode expansion layer, a first portion of the second cladding layer and a second portion of the second mode expansion layer are etched away to form a void. For instance, the manufacturer etches away the cladding layer 150 and the mode expansion layer 155 to form the void 240. After etching away the first portion and the second portion, the second cladding layer is regrown to fill the void. For instance, the manufacturer regrows the cladding layer 150 to fill the void 240. After the regrowing, a contact layer is epitaxially grown above the second cladding layer. For instance, the manufacturer epitaxially grows the contact layer 165. Finally, after epitaxially growing the contact layer, a third portion of the second cladding layer, a fourth portion of the contact layer, a fifth portion of the second cladding layer, and a sixth portion of the contact layer are etched away to form a ridge of the second cladding layer. For instance, the manufacturer etches away a portion of the cladding layer 150 and a portion of the contact layer 165 to form the first void 260 and etches away a portion of the cladding layer 150 and a portion of the contact layer 165 to form the second void 270, thus forming the ridge 160.

In a second embodiment, after epitaxially growing the first cladding layer and before epitaxially growing the first confinement layer, a first portion of the first cladding layer and a second portion of the first mode expansion layer are etched away, to form a void. For instance, the manufacturer etches away the cladding layer 530 and the mode expansion layer 580 to form the void 640. After etching away the first portion and the second portion, the first cladding layer is regrown to fill the void. For instance, the manufacturer regrows the cladding layer 530 to fill the void 640. After growing the second cladding layer, a contact layer is epitaxially grown above the second cladding layer. For instance, the manufacturer epitaxially grows the contact layer 565. Finally, after epitaxially growing the contact layer, a third portion of the second cladding layer, a fourth portion of the contact layer, a fifth portion of the second cladding layer, and a sixth portion of the contact layer are etched away to form a ridge of the second cladding layer. For instance, the manufacturer etches away a portion of the cladding layer 550 and a portion of the contact layer 565 to form the first void 660 and etches away a portion of the cladding layer 550 and a portion of the contact layer 565 to form the second void 670, thus forming the ridge 560. The first embodiment and the second embodiment may be combined as shown in FIGS. 3-4F.

In a third embodiment, the first mode expansion layer is etched to form a taper structure. For instance, the manufacturer etches the mode expansion layer 580 to form the taper structure shown in FIG. 7. In a fourth embodiment, the second mode expansion layer is etched to form a taper structure. For instance, the manufacturer etches the mode expansion layer 155 to form the taper structure shown in FIG. 7. The third embodiment and the fourth embodiment may be combined in the semiconductor laser 300 in FIG. 3.

The term "about" means a range including ±10% of the subsequent number unless otherwise stated. The term "substantially" means within ±10%. While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, components, techniques, or methods without departing from the scope of the present disclosure. Other items shown or discussed as coupled may be directly coupled or may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A method of manufacturing a semiconductor laser and comprising:

epitaxially growing a first cladding layer above a substrate;

epitaxially growing a first confinement layer above the first cladding layer;

epitaxially growing a quantum well layer above the first confinement layer;

epitaxially growing a second confinement layer above the quantum well layer;

epitaxially growing a second cladding layer above the second confinement layer; and epitaxially growing a first mode expansion layer within the first cladding layer so that the first mode expansion layer extends across a first width of the first cladding layer but not a first length or a first height of the first cladding layer, or epitaxially growing a second mode expansion layer within the second cladding layer so that the second mode expansion layer extends across a second width of the second cladding layer but not a second length or a second height of the first cladding layer.

2. The method of claim 1, further comprising etching away, after epitaxially growing the second mode expansion layer, a first portion of the second cladding layer and a second portion of the second mode expansion layer to form a void.

3. The method of claim 2, further comprising:
regrowing, after etching away the first portion and the second portion, the second cladding layer to fill the void; and
epitaxially growing, after the regrowing, a contact layer above the second cladding layer.

4. The method of claim 3, further comprising etching away, after epitaxially growing the contact layer, a third portion of the second cladding layer, a fourth portion of the contact layer, a fifth portion of the second cladding layer, and a sixth portion of the contact layer to form a ridge of the second cladding layer.

5. The method of claim 1, further comprising etching away, after epitaxially growing the first cladding layer and before epitaxially growing the first confinement layer, a first portion of the first cladding layer and a second portion of the first mode expansion layer to form a void.

6. The method of claim 5, further comprising:
regrowing, after etching away the first portion and the second portion, the first cladding layer to fill the void; and
epitaxially growing, after growing the second cladding layer, a contact layer above the second cladding layer.

7. The method of claim 6, further comprising etching away, after epitaxially growing the contact layer, a third portion of the second cladding layer, a fourth portion of the contact layer, a fifth portion of the second cladding layer, and a sixth portion of the contact layer to form a ridge of the second cladding layer.

8. The method of claim 1, further comprising etching the first mode expansion layer to form a taper structure.

9. The method of claim 1, further comprising etching the second mode expansion layer to form a taper structure.

10. A semiconductor laser comprising:
a first cladding layer epitaxially grown above a substrate;
a first confinement layer epitaxially grown above the first cladding layer;
a quantum well layer epitaxially grown above the first confinement layer;
a second confinement layer epitaxially grown above the quantum well layer;
a second cladding layer epitaxially grown above the second confinement layer; and
a first mode expansion layer epitaxially grown within the first cladding layer so that the first mode expansion layer extends across a first width of the first cladding layer but not a first length or a first height of the first cladding layer, or a second mode expansion layer epitaxially grown within the second cladding layer so that the second mode expansion layer extends across a second width of the second cladding layer but not a second length or a second height of the first cladding layer.

11. The semiconductor laser of claim 10, wherein the first mode expansion layer is etched to form a first taper structure or the second mode expansion layer is etched to form a second taper structure.

12. A semiconductor laser prepared by a process comprising the steps of:
epitaxially growing a first cladding layer above a substrate;
epitaxially growing a first confinement layer above the first cladding layer;
epitaxially growing a quantum well layer above the first confinement layer;
epitaxially growing a second confinement layer above the quantum well layer,
epitaxially growing a second cladding layer above the second confinement layer; and
epitaxially growing a first mode expansion layer within the first cladding layer so that the first mode expansion layer extends across a first width of the first cladding layer but not a first length or a first height of the first cladding layer, or epitaxially growing a second mode expansion layer within the second cladding layer so that the second mode expansion layer extends across a second width of the second cladding layer but not a second length or a second height of the first cladding layer.

13. The semiconductor laser of claim 12, wherein the process further comprises the step of etching away, after epitaxially growing the second mode expansion layer, a first portion of the second cladding layer and a second portion of the second mode expansion layer to form a void.

14. The semiconductor laser of claim 13, wherein the process further comprises the steps of:
regrowing, after etching away the first portion and the second portion, the second cladding layer to fill the void; and
epitaxially growing, after the regrowing, a contact layer above the second cladding layer.

15. The semiconductor laser of claim 14, wherein the process further comprises the step of etching away, after epitaxially growing the contact layer, a third portion of the second cladding layer, a fourth portion of the contact layer, a fifth portion of the second cladding layer, and a sixth portion of the contact layer to form a ridge of the second cladding layer.

16. The semiconductor laser of claim 12, wherein the process further comprises the step of etching away, after epitaxially growing the first cladding layer and before epitaxially growing the first confinement layer, a first portion of the first cladding layer and a second portion of the first mode expansion layer to form a void.

17. The semiconductor laser of claim 16, wherein the process further comprises the steps of:
regrowing, after etching away the first portion and the second portion, the first cladding layer to fill the void; and
epitaxially growing, after growing the second cladding layer, a contact layer above the second cladding layer.

18. The semiconductor laser of claim 17, wherein the process further comprises the step of etching away, after epitaxially growing the contact layer, a third portion of the second cladding layer, a fourth portion of the contact layer, a fifth portion of the second cladding layer, and a sixth portion of the contact layer to form a ridge of the second cladding layer.

19. The semiconductor laser of claim 12, wherein the process further comprises the step of etching the first mode expansion layer to form a taper structure.

20. The semiconductor laser of claim 12, wherein the process further comprises the step of etching the second mode expansion layer to form a taper structure.

21. The semiconductor laser of claim 10, further comprising a front facet, wherein the semiconductor laser is configured to emit an optical beam away from the front facet in a direction that is about perpendicular to the front facet and is about parallel to the first length and the second length.

\* \* \* \* \*